United States Patent [19]
Liu et al.

[11] Patent Number: 6,062,901
[45] Date of Patent: May 16, 2000

[54] LOW PROFILE BATTERY HOLDER ASSEMBLY FOR PRINTED CIRCUIT BOARD

[75] Inventors: Jia-Hung Liu, Hsin-Chuang; Jerry Wu, Chang-Hua Hsien, both of Taiwan

[73] Assignee: Hon Hai Precision Ind. Co., Ltd., Taipei Hsien, Taiwan

[21] Appl. No.: 09/104,931

[22] Filed: Jun. 25, 1998

[30] Foreign Application Priority Data

Nov. 27, 1997 [TW] Taiwan ................................. 86219778

[51] Int. Cl.⁷ ..................................................... H01R 3/00

[52] U.S. Cl. ........................................... 439/500; 429/100

[58] Field of Search ..................... 439/500, 600, 439/637; 429/100, 96

[56] References Cited

U.S. PATENT DOCUMENTS

| | | | |
|---|---|---|---|
| 5,188,912 | 2/1993 | Katoh et al. | 429/96 |
| 5,586,907 | 12/1996 | Frantz et al. | 439/500 |
| 5,876,241 | 3/1999 | Frantz | 439/500 |

*Primary Examiner*—Steven L. Stephan
*Assistant Examiner*—Barry M. L. Standig

[57] ABSTRACT

A battery holder assembly including a holder, positive and negative terminals secured to and extending out the holder, and a battery accommodated by the holder. The battery holder assembly is to be directly plugged into a printed circuit board. The battery is inserted into the holder along a direction substantially parallel to electrode surfaces thereof. The two terminals each have a respective terminal portion extending substantially parallel to the electrode surfaces of the battery so that the battery holder assembly occupies only a small space of the printed circuit board.

10 Claims, 4 Drawing Sheets

LOW PROFILE BATTERY HOLDER ASSEMBLY FOR PRINTED CIRCUIT BOARD

BACKGROUND OF THE INVENTION

The present invention relates to a battery holder assembly adapted to be mounted to an electronic device, e.g. a circuit board, and more particularly to a button battery holder assembly in which a button battery is so accommodated that its planar electrode surface is oriented substantially perpendicular to a general plane of the circuit board so that the holder occupies only a small area of the circuit board and the button battery can be held reliably in position.

U.S. Pat. No. 5,188,912 issued to Katoh et al. on Feb. 23, 1993 discloses a button battery holder which is adapted to be mounted into an electronic equipment in a direction parallel to opposite electrode surfaces of a button battery and which can prevent the button battery from being incorrectly inserted into the holder under the condition that the positive and negative electrode surfaces of the button are incorrectly oriented. The holder comprises a top plate having an opening, a bottom plate having a recess, a closed rear end wall and an open front end portion forming a button battery insert opening for introducing the button battery in the direction parallel to the electrode surfaces of the button battery. With this construction, as the holder is mounted into the electronic equipment in the direction parallel to the electrode surfaces of the button battery, a battery holder insert hole and a battery holder mounting portion to be formed in the electronic equipment can be made small, thereby contributing to a reduction in size of the electronic equipment.

In the Katoh et al. patent, a positive terminal and two negative terminals are provided in the electronic equipment whereby when the holder is inserted into the holder insert hole the terminals are maintained in electrical contact with the button battery through the recess of the bottom plate and the opening of the top plate, respectively. As can be understood, the construction of the holder of the Katoh et al. patent does not permit it to be readily applied to a circuit board.

Moreover, it is desired that an electrical energy supplying device like the above-mentioned holder will occupy as small as possible an area of an electronic device or a printed circuit board. The present invention thus aims to provide a battery holder assembly occupying a small area in a novel manner different from the disclosure of the Katoh et al. patent.

BRIEF SUMMARY OF THE INVENTION

The present invention provides a battery holder assembly which comprises a holder, positive and negative terminals secured to the holder and a battery accommodated within the holder along a direction substantially parallel to electrode surfaces of the battery. The battery holder assembly is to be plugged into an electronic device, e.g. a printed circuit board, through the positive and negative terminals extending outward from the holder, in such a way that the electrode surfaces of the battery are oriented substantially perpendicular to a general plane of the printed circuit board. Since the projected area of a battery as viewed along the electrode surfaces is smaller than that as viewed perpendicular to the electrode surfaces, the area of the printed circuit board occupied by the battery holder assembly is minimized.

According to a feature of the invention, the holder has a closed bottom and a battery-receiving portion opening at a top end thereof.

According to another feature of the invention, during insertion of the battery into the holder, the battery displaces and therefore is urged by one of the positive and negative terminals against the other terminal so as to be firmly held in position.

The battery holder assembly may further comprise a stop laterally extending from the holder to prevent the battery from sliding out of the holder.

Other objects, advantages and novel features of the invention will become more apparent from the following detailed description when taken in conjunction with the accompanying drawings.

DETAILED DESCRIPTION OF THE INVENTION

Figure 1:
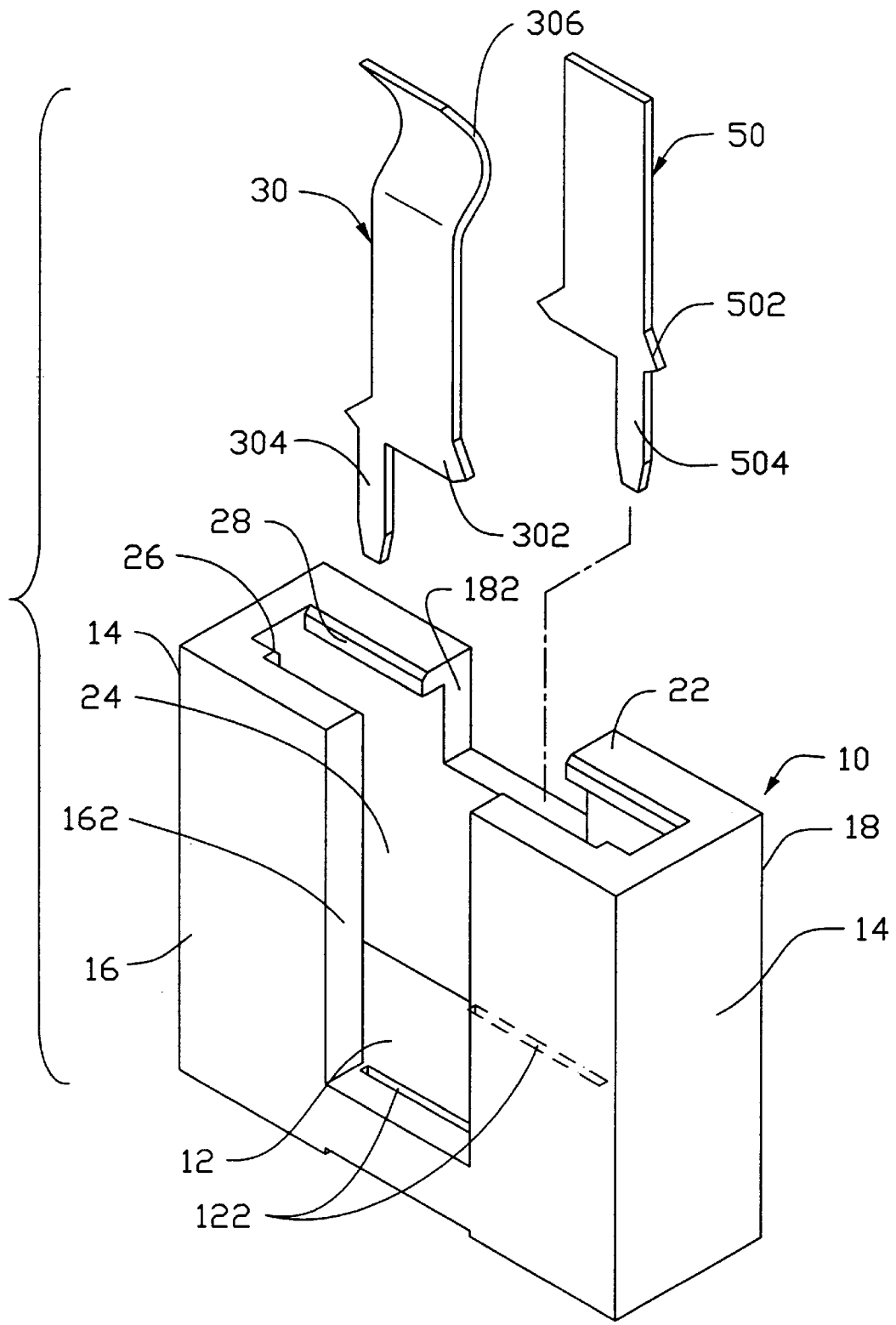
FIG. 1 is an exploded view of a battery holder assembly in accordance with the present invention, wherein a battery included in the assembly is omitted for clarity.
Figure 2:
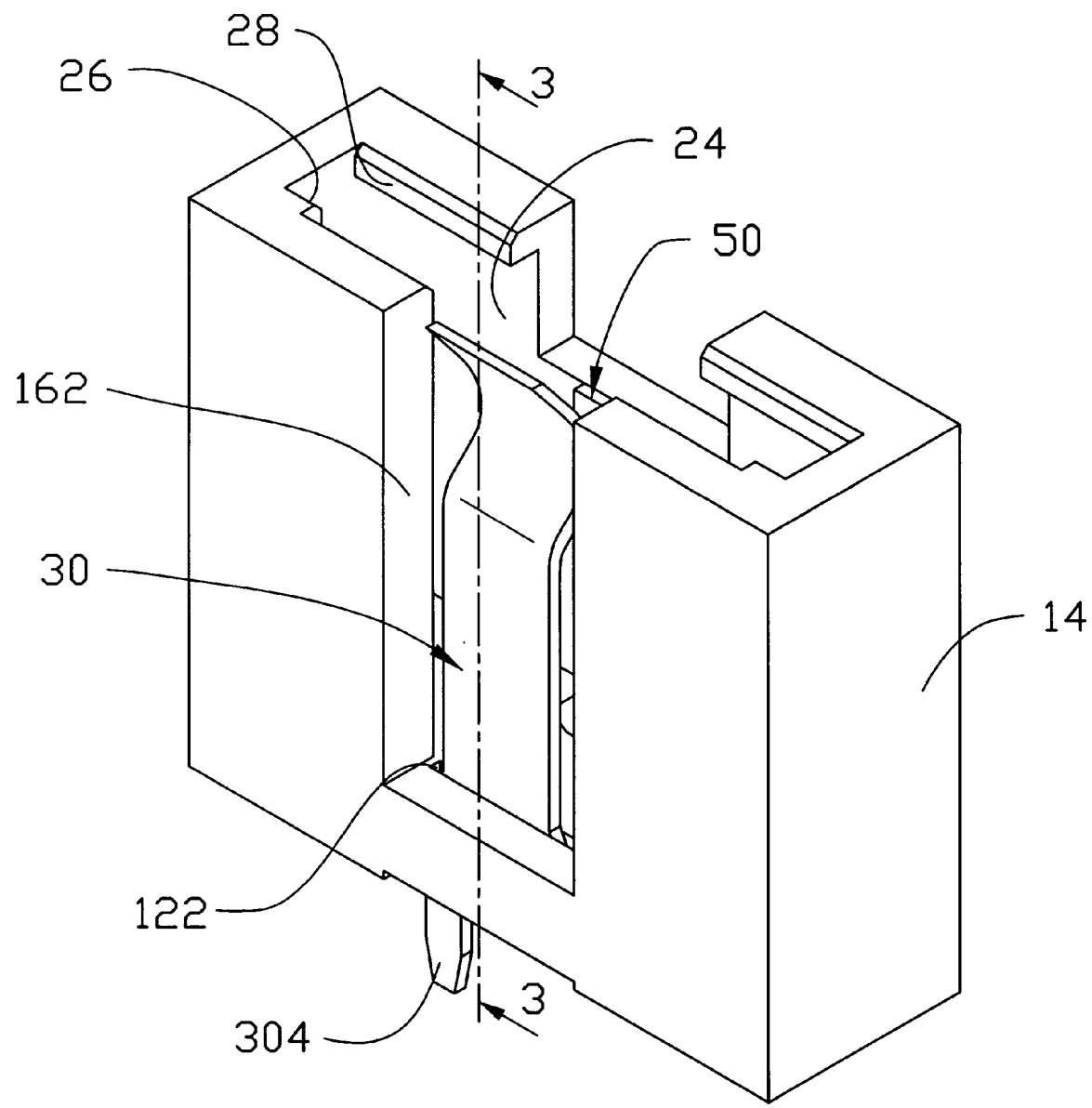
FIG. 2 is an assembled perspective view of the battery holder assembly of FIG. 1.
Figure 4:
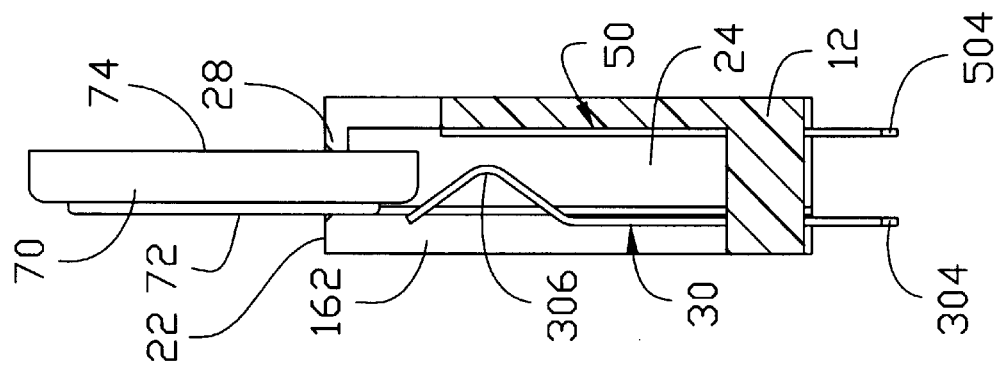
FIGS. 4 through 6 are views similar to FIG. 3, showing successive stages of inserting a battery into a holder in accordance with the present invention.
Figure 3:
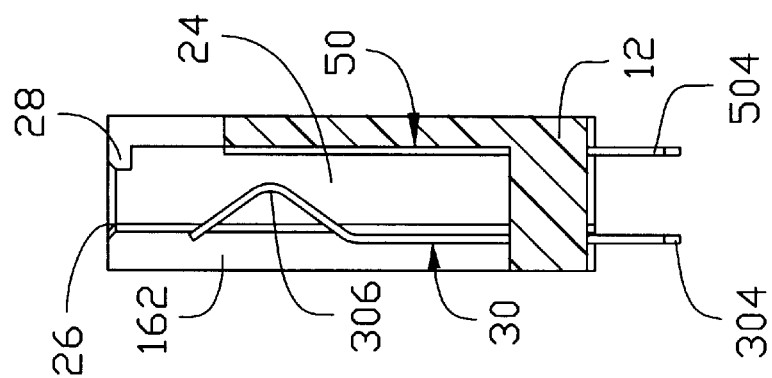
FIG. 3 is a cross-sectional view taken along line 4—4 of FIG. 2.
Figure 6:
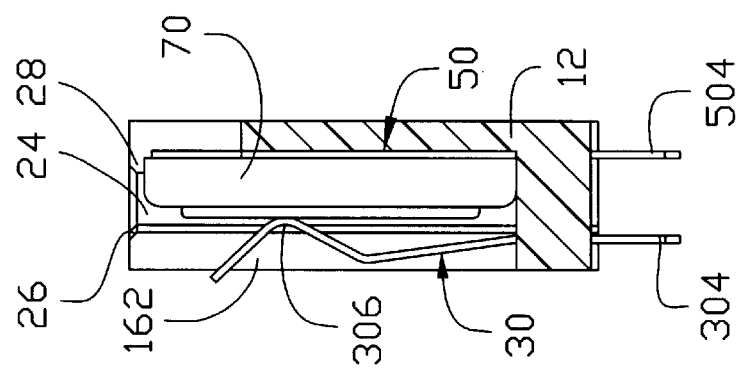
Figure 5:
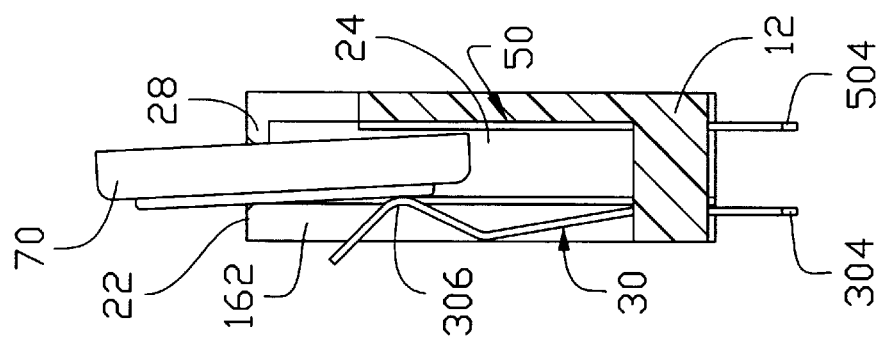

Referring to the drawing figures and initially to FIGS. 1 and 2, a battery holder assembly of the invention is shown in an exploded view and a perspective view, respectively. The assembly consists of a holder 10, a negative terminal 30, a positive terminal 50 and a battery 70 (shown only in FIGS. 4 through 6). The holder 10 is substantially rectangular-shaped. The battery 70 may suitably be a button battery as depicted in the figures which has positive and negative electrode surfaces 72 and 74. The battery holder assembly in accordance with the present invention is to be plugged into an electronic device (not shown), such as a printed circuit board (not shown), for supplying electrical energy thereto.

The holder 10 has a closed bottom 12, a pair of opposite side walls 14, a front wall 16, a rear wall 18 and a battery-receiving portion 24 defined by the closed bottom 12 and the walls 14, 16, 18 and opening at a top end 22 thereof. A first access opening 162 is formed on the front wall 16 and a second access opening 182 is formed on the rear wall 18. The first and second openings 162 and 182 together allow for easy access of a battery received within the battery-receiving portion 24, wherein the first opening 162 further provides space allowing outward deflection of the corresponding negative terminal 30 when the battery 70 is fully installed within the holder 10.

The negative and positive terminals 30 and 50 are made of resilient materials. The positive terminal 30 extends through and is secured to the bottom 12 of the holder 10. Similarly, the negative terminal 50 also extends through and is secured to the bottom 12. Particularly, the bottom 12 is formed with two slits 122 and the negative and positive terminals 30 and 50 each form barbs 302 and 502 whereby the negative and positive terminals 30 and 50 can be suitably anchored in the corresponding slit 122. Alternatively, the terminals 30 and 50 may be molded with the bottom 12, thereby eliminating the need to pre-form the slits 122. After the terminals 30 and 50 are secured to the holder 10, the positive terminal 50 is spaced from the negative terminal 30 a predetermined distance and each terminal 30 or 50 has a terminal portion 304 or 504 extending out of the bottom 12 of the holder 10 in a direction substantially parallel to the electrode surfaces of the battery. With this construction, the battery holder assembly of the invention only occupies a small area on a printed circuit board as is determined by the surface area of the bottom 12.

The negative terminal 30 has a convex curved portion 306 facing the positive terminal 50. Also, to prevent incorrect orientation of the battery 70 during insertion into the battery-receiving portion 24, a pair of protrusions 26 are vertically formed on a respective junction of the front wall 16 and the side walls 14 and protrude into the battery-receiving portion 24. Furthermore, a respective stop 28 is formed on opposite sides of the access opening 182 of the rear wall 18 and laterally extends from the top end 22 of the holder into the battery-receiving portion 24.

Insertion of the battery 70 into the holder 10 and relevant relationship of the terminals 30 and 50 will now be further described with particular reference to FIGS. 3 through 6.

Insertion of the battery 70 into the battery-receiving portion 24 is performed along a direction substantially parallel to the electrode surfaces 72 and 74 thereof. During insertion of the battery 70, the battery 70 displaces the negative terminal 30, in particular its curved portion 306, because the predetermined distance between the terminals 30 and 50 is smaller than a thickness of the battery 70. After the battery 70 is fully inserted into the battery-receiving portion 24, it is urged by the negative terminal 30 to bear against the positive terminal 50. With this construction, the battery 70 is firmly held between the two terminals 30 and 50. The stop 28 further prevents the battery 70 from inadvertently sliding out of the battery-receiving portion 24 while permitting a normal insertion or withdrawal of the battery 70 into or out of the battery-receiving portion 24.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A battery holder assembly for plugging into an electronic device comprising:
    a substantially rectangular holder having a first pair of walls, a second pair of walls smaller than the first pair of walls, a closed bottom and a battery-receiving portion opening at a top end thereof, a first and a second access openings being defined in the first pair of walls, respectively;
    a first terminal extending through and secured to the bottom of the holder, the first terminal extending in a direction substantially parallel to the first pair of walls and being exposed to the first access opening, the first terminal being displaceable outward and inward via the first access opening; and
    a second terminal extending through and secured to the bottom, the second terminal being spaced from the first terminal a predetermined distance and extending in said direction substantially parallel to the first pair of walls, the second terminal being located substantially below the second access opening.

2. The battery holder assembly as claimed in claim 1, wherein the bottom of the holder has two slits respectively proximate the first pair of walls for the first and second terminals to be anchored therein.

3. The battery holder assembly as claimed in claim 1, wherein each terminal has a terminal portion extending out of the bottom of the holder in a direction substantially parallel to the first pair of walls of the holder.

4. The battery holder assembly as claimed in claim 1, wherein the first terminal comprises a curved portion for electrically contacting the battery.

5. The battery holder assembly as claimed in claim 1, wherein the first terminal forms a convex curved portion at an end thereof facing the second terminal for urging a battery received in the battery-receiving portion against the second terminal.

6. The battery holder assembly as claimed in claim 1, wherein one of the first pair of walls adjacent to the first terminal includes a protrusion for preventing mis-orientation of the battery with respect to the holder.

7. The battery holder assembly as claimed in claim 1, wherein a stop laterally extends from the top end of the holder into the battery-receiving portion to prevent the battery from vertically sliding out of the battery-receiving portion.

8. A battery holder for receiving a battery therein and for use with an electronic device comprising:
    a pair of walls opposite to each other defining a battery-receiving portion therein;
    a first terminal extending along and adjacent to one of said walls;
    a second terminal extending along and adjacent to the other of said walls; wherein
    said first terminal includes a curved portion for urging said battery against said second terminal, and wherein the wall adjacent to the second terminal includes a stop laterally extending from a top portion thereof so as to prevent the battery from sliding out of the battery-receiving portion after the battery has been fully installed into the holder.

9. The battery holder as claimed in claim 8, wherein the wall adjacent to the first terminal includes at least one protrusion for preventing mis-orientation of the battery with regard to the holder.

10. The battery holder as claimed in claim 8, wherein the wall adjacent the first terminal defines an access opening beside said first terminal for allowing outward and inward deflection of the first terminal.

* * * * *